(12) United States Patent
Liu et al.

(10) Patent No.: US 6,893,886 B2
(45) Date of Patent: May 17, 2005

(54) METHOD FOR PROCESSING ONE-DIMENSIONAL NANO-MATERIALS

(75) Inventors: Liang Liu, Beijing (CN); Shoushan Fan, Beijine (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 16 days.

(21) Appl. No.: 10/400,746

(22) Filed: Mar. 26, 2003

(65) Prior Publication Data

US 2004/0053432 A1 Mar. 18, 2004

(30) Foreign Application Priority Data

Sep. 17, 2002 (CN) ........................................ 02134777 A

(51) Int. Cl.[7] .......................... H01L 21/00; H01L 21/44
(52) U.S. Cl. ........................................ 438/20; 438/666
(58) Field of Search .................... 438/20, 666; 313/355

(56) References Cited

U.S. PATENT DOCUMENTS 6,383,923 B1 * 5/2002 Brown et al. ............... 438/666
6,719,841 B2 * 4/2004 Chen et al. ................... 117/87
6,741,019 B1 * 5/2004 Filas et al. .................. 313/355

* cited by examiner

Primary Examiner—David S. Blum
(74) Attorney, Agent, or Firm—Wei Te Chung

(57) ABSTRACT

A method for processing one-dimensional nano-materials includes the following steps: providing a substrate (11); forming one-dimensional nano-materials (12) on the substrate, the one-dimensional nano-materials being substantially parallel to each other and each being substantially perpendicular to the substrate, the one-dimensional nano-materials cooperatively defining a top surface distal from the substrate; and applying physical energy (14) by means of a high-energy pulse laser beam to the top surface of the one-dimensional nano-materials. The resulting one-dimensional nano-materials have sharp, tapered tips (15, 15'). Distances between adjacent tips are approximately uniform, and are relatively large. This reduces shielding between adjacent one-dimensional nano-materials. The tips also contribute to a decreased threshold voltage required for field emission by the one-dimensional nano-materials.

21 Claims, 6 Drawing Sheets

METHOD FOR PROCESSING ONE-DIMENSIONAL NANO-MATERIALS

BACKGROUND OF THE INVENTION

1. Field of the Invention

The present invention relates to methods for processing nano-materials, and more particularly to methods for processing one-dimensional nano-materials. This application relates to a contemporaneously filed application having the same applicant and same assignee with the instant invention, and titled "FIELD EMISSION DEVICE" referring to the same device.

2. Description of Prior Art

Nano-materials are materials having special electrical, magnetic, optical, thermal, physical and chemical properties. Nano-materials play an important role in research in mesoscopic science and in nano-devices. One-dimensional nano-materials are those whose structure have an aspect ratio in the range from 10 to 1000. Carbon nanotubes are a well-known kind of one-dimensional nano-material.

Carbon nanotubes have superior electron emission capability at low emission voltages, generally less than 100 volts. Furthermore, carbon nanotubes can carry high electric currents reliably. Due to these properties, carbon nanotubes are considered to be an ideal material for applications in a variety of display devices, including flat panel displays, such as field emission displays.

Existing carbon nanotube synthesis techniques include arc discharge, laser vaporization, and chemical vapor deposition (CVD). Carbon nanotubes formed by any of these methods alone cannot satisfactorily be used as field emission material for the following reasons. Carbon nanotubes formed using the arc discharge and laser vaporization methods have non-uniform heights and orientations, and are prone to be tangled together. If the carbon nanotubes are directly used as field emission material, they tend to reduce field concentration and field efficiency. Carbon nanotubes formed using the chemical vapor deposition method have uniform height and are well aligned. However, the high density of carbon nanotubes formed is inclined to induce shielding between adjacent carbon nanotubes. In addition, cavities at the tips of carbon nanotubes are encapsulated by catalytic metal particles, thereby reducing field concentration and efficiency.

For carbon nanotubes to be successfully applied in electronic devices, their electron emission properties must be optimized. This can be done by processing the carbon nanotubes. Many techniques have been devised to improve the field concentration and efficiency of carbon nanotubes. These techniques include opening the tips of the carbon nanotubes, purifying the carbon nanotubes, and re-orienting the carbon nanotubes.

A method for opening tips of carbon nanotubes and purifying the carbon nanotubes is disclosed in China patent application CN1292354A. FIG. 10 is a schematic sectional illustration of the method, in which a laser beam is used to open the tips and purify the carbon nanotubes. The method includes the following steps: (1) aligning crude carbon nanotubes 112 perpendicularly on a substrate 110; (2) irradiating the crude carbon nanotubes 112 with a laser beam 140 generated by a laser generator 144, the irradiation occurring at a predetermined height in a direction parallel to a major surface of the substrate to cut off the tips from the crude carbon nanotubes; and (3) removing the tips from the crude carbon nanotubes. However, the laser generator 144 must be accurately adjusted to ensure that the crude carbon nanotubes 112 are irradiated by the laser beam 140 at the correct height. This makes the method unduly time-consuming. Furthermore, after processing, the carbon nanotubes are still densely configured. This induces shielding between adjacent carbon nanotubes, reduces field concentration and efficiency, and increases a threshold voltage of field emission.

Other one-dimensional nano-materials such as nanowires, nanorods and nanofibers that are used as field emission materials have similar problems and limitations as those described above in relation to carbon nanotubes. These difficulties greatly limit industrial applications of the one-dimensional nano-materials.

SUMMARY OF THE INVENTION

In view of the above-described drawbacks, an object of the present invention is to provide a method for processing one-dimensional nano-materials which reduces shielding between adjacent one-dimensional nano-materials.

Another object of the present invention is to provide a method for processing one-dimensional nano-materials which decreases a field emission threshold voltage thereof.

A further object of the present invention is to provide a method for processing one-dimensional nano-materials which cleans surfaces of the one-dimensional materials.

In order to achieve the objects set out above, a preferred method of the present invention for processing one-dimensional nano-materials comprises the following steps: providing a substrate; forming one-dimensional nano-materials on the substrate, the one-dimensional nano-materials being substantially parallel to each other and each being substantially perpendicular to the substrate, the one-dimensional nano-materials cooperatively defining a top surface distal from the substrate; and applying physical energy by means of a high-energy pulse laser beam to the top surface of the one-dimensional nano-materials. The resulting one-dimensional nano-materials have sharp, tapered tips. Distances between adjacent tips are approximately uniform, and are relatively large. This reduces shielding between adjacent one-dimensional nano-materials. The tips also contribute to a decreased threshold voltage required for field emission by the one-dimensional nano-materials.

Other objects, advantages and novel features of the present invention will become more apparent from the following detailed description when taken in conjunction with the accompanying drawings, in which:

DETAILED DESCRIPTION OF PREFERRED EMBODIMENTS OF THE INVENTION

Figure 1:
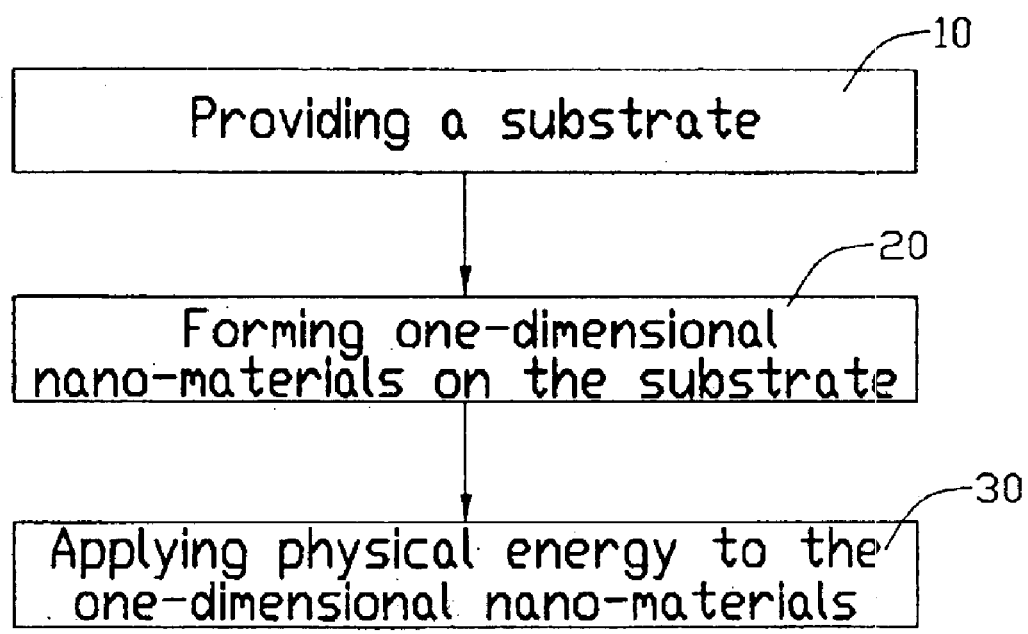
FIG. 1 is a flowchart of a preferred method for processing one-dimensional nano-materials according to the present invention.

A preferred method for processing one-dimensional nano-materials according to the present invention will be described with reference to the flowchart of FIG. 1.

Figure 2:
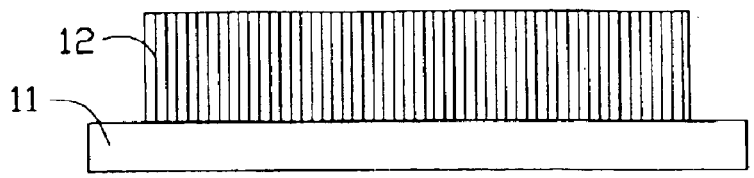
FIG. 2 is a schematic sectional view of carbon nanotubes formed on a substrate according to the preferred method.

Referring also to FIG. 2, a substrate 11 is first provided (step 10). The substrate 11 can be made of glass, silicon, alumina or another suitable material. Then one-dimensional nano-materials 12 are formed on the substrate 11 (step 20). The one-dimensional nano-materials 12 can be carbon nanotubes, nanofibers, nanorods, or nanowires. In the preferred method, the one-dimensional nano-materials 12 are carbon nanotubes 12. The carbon nanotubes 12 can be formed by growing them on the substrate 11 directly, or by transplanting pre-prepared carbon nanotubes onto the substrate 11. The carbon nanotubes 12 are substantially parallel to each other, and are each substantially perpendicular to the substrate 11. The carbon nanotubes 12 cooperatively define a top surface (not labeled) distal from the substrate 11.

Figure 3:
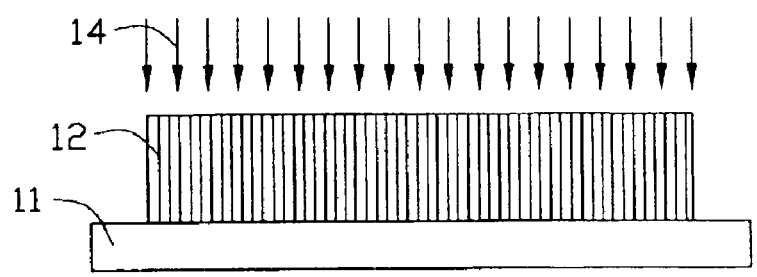
FIG. 3 is a schematic sectional view of applying physical energy to the carbon nanotubes illustrated in FIG. 2, according to the preferred method.

Referring also to FIG. 3, physical energy 14 is then applied to the top surface of the carbon nanotubes 12 along a direction perpendicular to the substrate 11 (step 30).

Generally, step 30 is performed under the protection of an ambient gas (not shown). The ambient gas can be nitrogen, hydrogen, a gas only partially containing oxygen, or any suitable combination thereof. A gas only partially containing oxygen should not pose any appreciable risk of oxygen burnout of the carbon nanotubes 12, even at room temperature. It is necessary to keep a pressure of the ambient gas greater than 0.2 standard atmospheric pressure, and preferably in the range from 0.5 to 1.5 standard atmospheric pressure. This facilitates formation of the carbon nanotubes 12 such that they have a desired shape.

Figure 4:
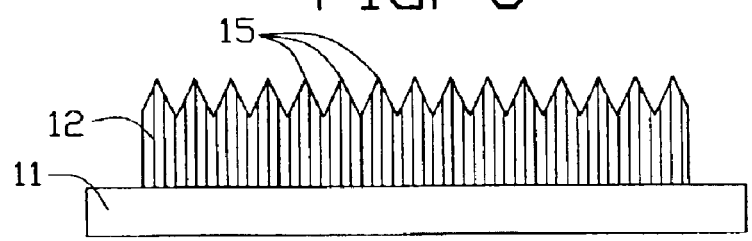
FIG. 4 is a schematic sectional view of the carbon nanotubes illustrated in FIG. 3 after application of the physical energy according to the preferred method.

In the preferred method, the physical energy 14 is applied by means of a high-energy pulse laser beam 14. The laser beam 14 is generated by an excimer laser generator. A preferred wavelength of the laser beam 14 is 308 nanometers. This irradiation of the carbon nanotubes 12 is performed in air at less than 1 standard atmospheric pressure, and at room temperature. A power of each pulse of the laser beam 14 is 150 millijoules. An area of irradiation by the laser beam 14 is 0.5 square centimeters. Preferably, twenty pulses are applied to the carbon nanotubes 12. A thin layer of the top surface of the carbon nanotubes 12 is burned off by the laser beam 14. Catalyst particles adhering to the carbon nanotubes 12 and byproducts such as amorphous carbon deposited on outer walls of the carbon nanotubes 12 are also removed. The application of the laser beam 14 also contributes to rapid expansion of air contained in gaps between upper portions of the carbon nanotubes 12. The upper portions have a length of several tens of micrometers. The rapid expansion of the air presses the upper portions of adjacent carbon nanotubes 12 against each other, to form sharp, tapered tips 15 (see FIG. 4). The laser beam 14 is then switched off.

Each tip 15 is oriented substantially perpendicular to the substrate 11. That is, substantially in the direction of irradiation by the laser beam 14. Distances between adjacent tips 15 are approximately uniform, and are relatively large. This reduces shielding between adjacent carbon nanotubes 12. The tips 15 also contribute to a decreased threshold voltage required for field emission by the carbon nanotubes 12.

Generally, it is necessary to prevent the air contained in the gaps between the upper portions of the carbon nanotubes 12 from expanding too much or too quickly. Otherwise, connections between the carbon nanotubes 12 and the substrate 11 may be impaired or broken. Accordingly, an intensity of the laser beam 14 can be reduced, and a number of pulses of the laser beam 14 can be increased to more than 20. These conditions yield carbon nanotubes 12 having the above-described tips 15. Under these conditions, the risk of connections between the carbon nanotubes 12 and the substrate 11 being impaired or broken is minimized.

Figure 7:
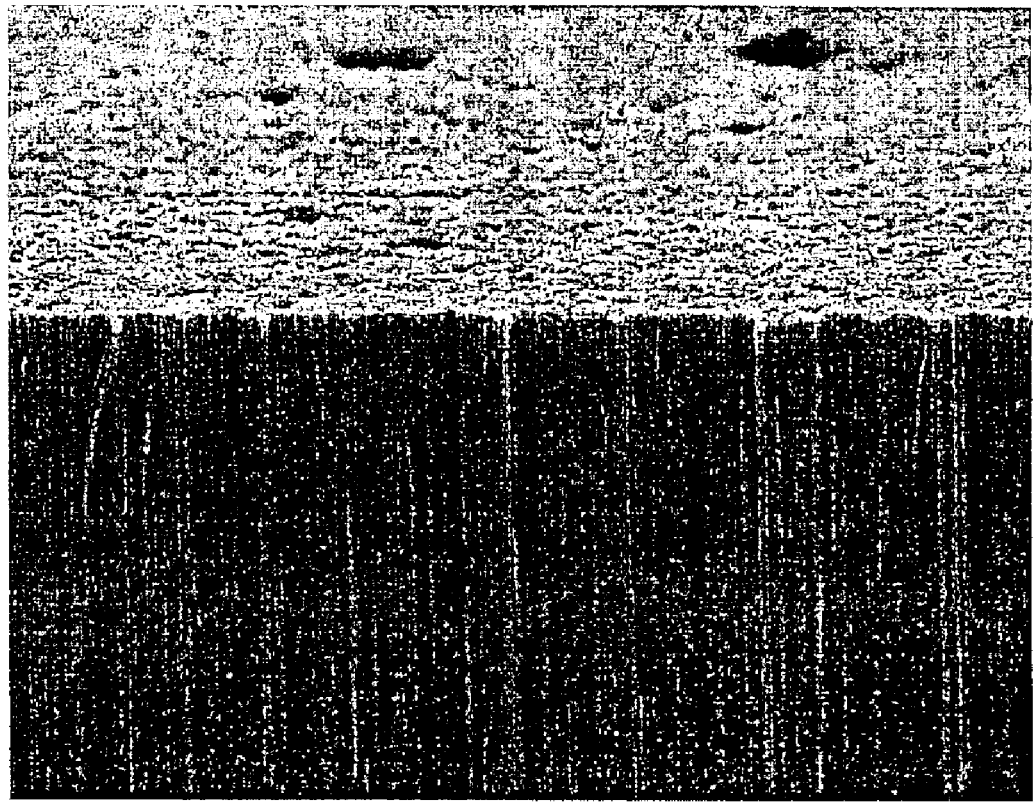
FIG. 7 shows a scanning electron microscope (SEM) image of the carbon nanotubes of FIG. 2.
Figure 8:
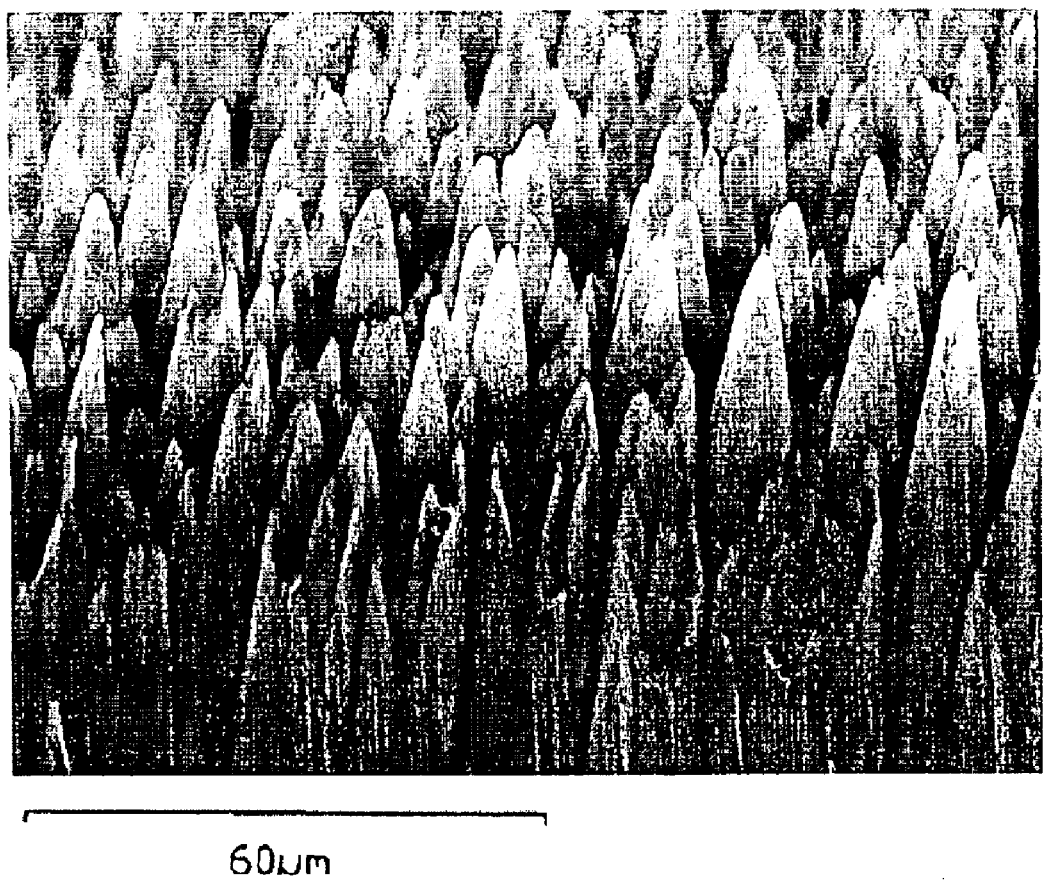
FIG. 8 shows an SEM image of the carbon nanotubes of FIG. 4.

FIGS. 7 and 8 show SEM images of carbon nanotubes 12 before and after performing step 30 of the preferred method respectively. As can be seen, after processing, the carbon nanotubes 12 comprise a plurality of rod-shaped lower portions and a plurality of corresponding tapered tips 15 above the lower portions. The lower portions have an average diameter of approximately 10 micrometers. Distal ends of the tips 15 have an average diameter of approximately several tens of nanometers. The tips 15 have an average length of approximately 30 micrometers. Distances between adjacent tips 15 are approximately uniform, and are relatively large.

Figure 5:
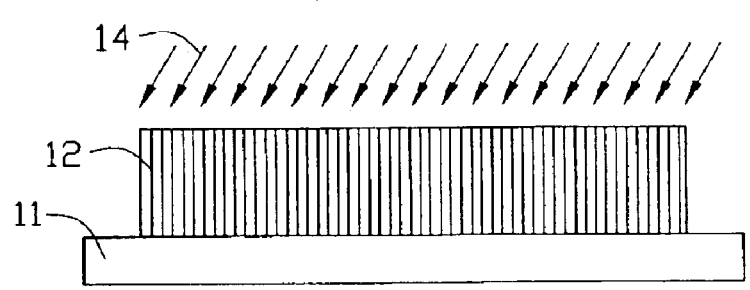
FIG. 5 is a schematic sectional view of applying physical energy to the carbon nanotubes illustrated in FIG. 2, according to an alternative method of the present invention.
Figure 6:
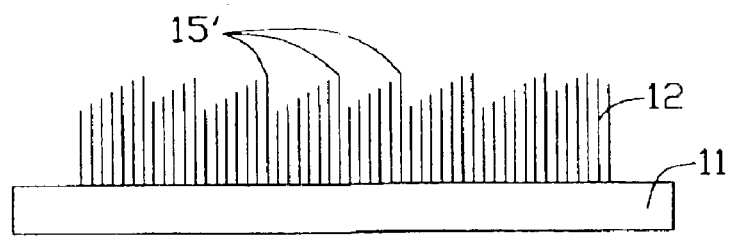
FIG. 6 is a schematic sectional view of the carbon nanotubes illustrated in FIG. 5 after application of the physical energy according to the alternative method.

Referring to FIGS. 5 and 6, an alternative method for processing one-dimensional nano-materials according to the present invention is similar to the above-described preferred method. However, the laser beam 14 irradiates the top surface of carbon nanotubes 12 at an angle relative to an imaginary line that is perpendicular to the substrate 11. In principle, a maximum such angle is determined by the pressure of the ambient gas, which in turn is proportional to a density of the carbon nanotubes 12. When the angle is greater than the maximum angle, it is difficult to form sharp, tapered tips on the carbon nanotubes 12. Generally, the maximum angle is in the range from one degree to thirty-five degrees. Preferably, the angle is thirty degrees. When twenty pulses of the laser beam are applied to the carbon nanotubes 12, sharp, tapered tips 15' are formed on the carbon nanotubes 12. The tips 15' are substantially parallel to each other. An angle of slanting of the tips 15' is substantially the same as the angle at which the laser beam 14 irradiated the carbon nanotubes 12. That is, a slant of the tips 15' is substantially parallel to the direction in which the laser beam 14 irradiated the carbon nanotubes 12. Distances between adjacent tips 15' are approximately uniform, and are relatively large. This reduces shielding between carbon nanotubes 12. The tips 15' also contribute to a decreased threshold voltage required for field emission by the carbon nanotubes 12.

Figure 9:
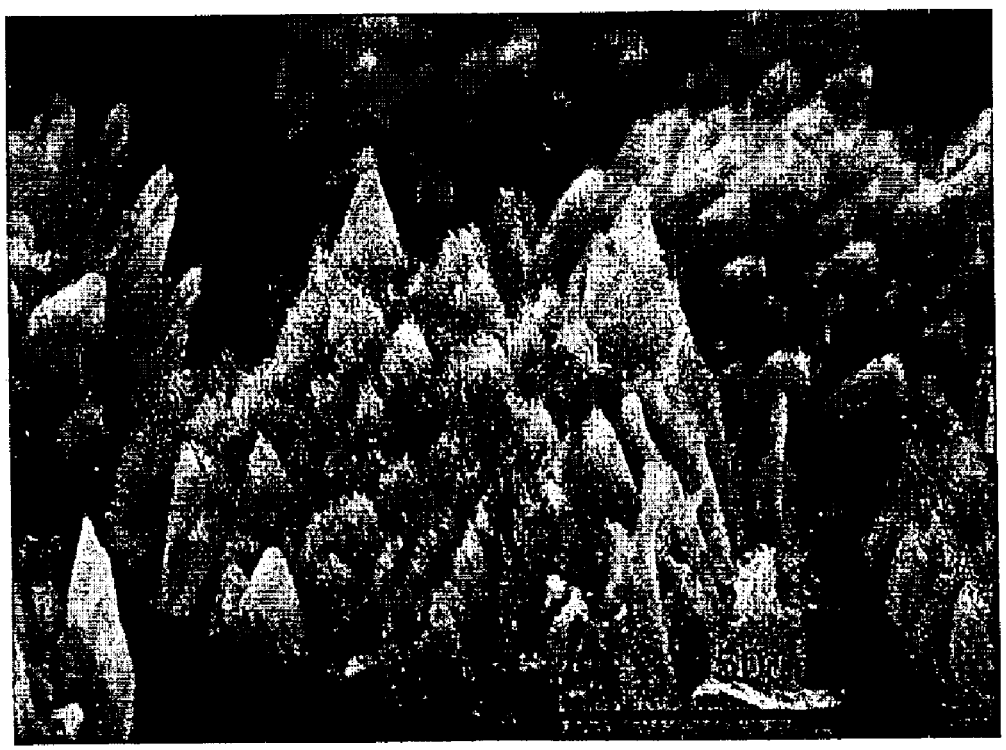
FIG. 9 shows an SEM image of the carbon nanotubes of FIG. 6.
Figure 10:
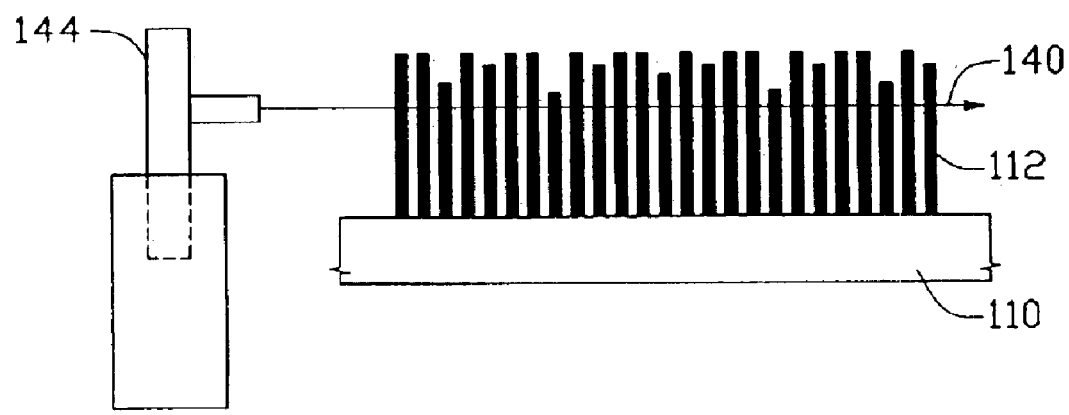
FIG. 10 is a schematic sectional illustration of a conventional method for opening tips of and purifying carbon nanotubes.

FIG. 9 shows an SEM image of carbon nanotubes 12 after performing the alternative method. As can be seen, after processing, the carbon nanotubes 12 comprise a plurality of rod-shaped lower portions and a plurality of corresponding slanted, tapered tips 15' above the lower portions. The lower portions have an average diameter of approximately 10 micrometers. Distal ends of the tips 15' have an average diameter of approximately several tens of nanometers. The tips 15' have an average length of approximately 30 micrometers. Distances between adjacent tips 15' are approximately uniform, and are relatively large.

It will be apparent to those having skill in the field of the present invention that the method of the present invention is suitable for other one-dimensional nano-materials such as nanofibers, nanorods, nanowires and the like. The method can be used to shape such one-dimensional nano-materials as desired. The intensity of the laser beam 14, the number of pulses of the laser beam 14 applied, and the type of ambient gas and pressure thereof can all be adjusted to obtain any of a variety of desired one-dimensional nano-materials.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A method for processing one-dimensional nano-materials, comprising the following steps:
   (1) providing a substrate;
   (2) forming one-dimensional nano-materials on the substrate, the one-dimensional nano-materials cooperatively defining top portions distal from the substrate; and
   (3) applying physical energy to said top portions of the one-dimensional nano-materials so as to reform the top portions into a plurality of tapered tips.

2. The method for processing one-dimensional nano-materials as described in claim 1, wherein step (3) is performed under the protection of an ambient gas selected from the group consisting of nitrogen, hydrogen, a gas only partially containing oxygen, and any suitable combination thereof.

3. The method for processing one-dimensional nano-materials as described in claim 1, wherein the one-dimensional nano-materials are substantially parallel to each other, and are each substantially perpendicular to the substrate.

4. The method for processing one-dimensional nano-materials as described in claim 1, wherein a material of the substrate is selected from the group consisting of glass, silicon, and alumina.

5. The method for processing one-dimensional nano-materials as described in claim 1, wherein the physical energy is a pulse laser beam.

6. The method for processing one-dimensional nano-materials as described in claim 5, wherein the laser beam has a wavelength of 308 nanometers.

7. The method for processing one-dimensional nano-materials as described in claim 5, wherein a power of each pulse of the laser beam is approximately 150 millijoules.

8. The method for processing one-dimensional nano-materials as described in claim 5, wherein an area of irradiation by the laser beam is approximately 0.5 square centimeters.

9. The method for processing one-dimensional nano-materials as described in claim 1, wherein the one-dimensional nano-materials are carbon nanotubes.

10. The method for processing one-dimensional nano-materials as described in claim 1, wherein the one-dimensional nano-materials formed are selected from the group consisting of nanowires, nanorods and nanofibers.

11. The method for processing one-dimensional nano-materials as described in claim 1, wherein the physical energy is applied to the said top portions of the one-dimensional nano-materials along a direction substantially perpendicular to the substrate.

12. The method for processing one-dimensional nano-materials as described in claim 1, wherein the physical energy is applied to said top portions of the one-dimensional nano-materials at an angle relative to an imaginary line that is perpendicular to the substrate, the angle being in the range from one degree to thirty-five degrees.

13. The method for processing one-dimensional nano-materials as described in claim 1, wherein the physical energy is applied to said top portions of the one-dimensional nano-materials at an angle relative to an imaginary line that is perpendicular to the substrate, the angle being approximately thirty degrees.

14. The method for processing one-dimensional nano-materials as described in claim 2, wherein a pressure of the ambient gas is greater than 0.2 standard atmospheric pressure.

15. The method for processing one-dimensional nano-materials as described in claim 2, wherein a pressure of the ambient gas is in the range from 0.5 to 1.5 standard atmospheric pressure.

16. The method for processing one-dimensional nano-materials as described in claim 1, wherein the physical energy is applied at room temperature.

17. A method for processing nano-materials, comprising the steps of:
   providing a substrate extending in a plane defined by first and second directions;
   forming nano-materials on said substrate along a third direction essentially perpendicular to said first and second directions;
   flattening top portions of said nano-materials, the top portions being distal from the substrate; and
   applying energy on said flattened top portions to reform said flattened top portions into a plurality of apexes around a same level.

18. The method for processing nano-materials as described in claim 17, wherein said apexes are essentially arranged evenly in said first and second directions.

19. A method for making a field emission device, comprising the steps of:
   densely forming a plurality of nanotubes on a substrate;
   trimming top portions of at least some of the nanotubes to be at a same level, the top portions being distal from the substrate; and
   reforming said trimmed top portions into a plurality of tapered tips; wherein
   said tapered tips are generally evenly arranged on said substrate.

20. The method as described in claim 19, wherein each of said tapered tips is formed by one slanted side and one vertical side.

21. A method for processing one-dimensional nano-materials, comprising the following steps:
   (1) providing a substrate;
   (2) forming one-dimensional nano-materials on the substrate, the one-dimensional nano-materials cooperatively defining a surface distal from the substrate; and
   (3) applying physical energy to said surface of the one-dimension nano-materials at an angle relative to an imaginary line that is perpendicular to the substrate, the angle being approximately thirty degrees.

* * * * *